(12) United States Patent
Wang et al.

(10) Patent No.: US 7,692,205 B2
(45) Date of Patent: Apr. 6, 2010

(54) SEMICONDUCTOR LIGHT-EMITTING DEVICE

(75) Inventors: Li Wang, Nanchang (CN); Fengyi Jiang, Jiang Xi (CN); Wenqing Fang, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 0 days.

(21) Appl. No.: 12/067,767

(22) PCT Filed: Sep. 29, 2006

(86) PCT No.: PCT/CN2006/002582

§ 371 (c)(1),
(2), (4) Date: Mar. 21, 2008

(87) PCT Pub. No.: WO2007/036162

PCT Pub. Date: Apr. 5, 2007

(65) Prior Publication Data

US 2008/0246048 A1    Oct. 9, 2008

(30) Foreign Application Priority Data

Sep. 30, 2005    (CN) .................. 2005 1 0030320

(51) Int. Cl.
*H01L 27/15* (2006.01)

(52) U.S. Cl. .............. 257/98; 257/E33.067; 372/43.01; 372/50.1

(58) Field of Classification Search .................. 257/98, 257/96, 97, E33.067; 372/45.011, 43.01, 372/44.01, 50.1, 50.12
See application file for complete search history.

(56) References Cited

U.S. PATENT DOCUMENTS 5,828,684 A * 10/1998 Van de Walle ......... 372/45.011
6,597,713 B2 * 7/2003 Ouchi .......................... 372/36

OTHER PUBLICATIONS

Y. Hayashi et al., Record low-threshold index-guided InGaAs/GaAlAs vertical-cavity surface-emitting laser with a native oxide confinement structure, Mar. 30, 1995, Electronics Letters, vol. 31, pp. 560-562.*

* cited by examiner

*Primary Examiner*—Sue Purvis
*Assistant Examiner*—S. Mulcare
(74) *Attorney, Agent, or Firm*—Park, Vaughn & Fleming LLP; Shun Yao

(57) ABSTRACT

A semiconductor light-emitting device, the device includes a substrate, a semiconductor stacked layer, a lead electrode and a lead, wherein the semiconductor stacked layer at least includes a N-type layer and a P-type layer, at least one of the N-type layer and the P-type layer has an opening, the opening is just beneath the lead; or includes a conductive substrate having a main surface and a back surface, an adhesive metal layer, a reflective/ohmic metal layer, a semiconductor stacked layer, a lead electrode and a lead sequentially deposited on the main surface of the substrate, the reflective/ohmic metal layer has an opening, the opening is just beneath the lead.

6 Claims, 2 Drawing Sheets

SEMICONDUCTOR LIGHT-EMITTING DEVICE

RELATED APPLICATION

This application is a national-stage application of and hereby claims priority under 35 U.S.C. §365(c) to the PCT Application No PCT/CN2006/002582, filed 29 Sep. 2006, which claims priority to China Patent Application No. 200510030320.2, filed 30 Sep. 2005.

TECHNOLOGY FIELD

The present invention relates to a semiconductor light-emitting device, and, more specifically, to a light-emitting device based on InGaAlN ($In_xGa_yAl_{1-x-y}N$, $0 \leq x \leq 1$, $0 \leq y \leq 1$) material.

TECHNICAL BACKGROUND

Semiconductor light-emitting devices are an important type of semiconductor device with a wide range of applications. For example, semiconductor light-emitting diodes (LED) have been used for indicator lights, signal panels, and traffic lights. Recently developed InGaAlN-based LEDs are expanding LED application to the domain of lighting. In order to achieve the objective of using LED for general lighting, it is essential to increase the efficiency of current LEDs. FIG. 1 illustrates the structure of a typical LED. In the figure, label "1" refers to a substrate, label "2" refers to a semiconductor epitaxial layer stack, label "3" refers to an electrode, and label "4" refers an electrode lead wire. Normally, an ohmic contact is formed between electrode 3 and semiconductor epitaxial layer stack 2. There is another electrode at the backside of the substrate. During operation, current is introduced from electrode lead wire 4 into semiconductor epitaxial layer stack 2 through electrode 3, exciting light emission inside the layer stack. The current then flows out of the device from the backside electrode. The light generated inside semiconductor epitaxial layer stack 2 is emitted from the upper surface (the downward propagated light is also emitted from the upper surface after being reflected). From the figure, one can see that the presence of electrode lead wire 4 blocks the light generated by the epitaxial layer stack situated underneath the electrode lead wire, thus preventing the light from being emitted outside the device. As a result, the light-emitting efficiency of the device is reduced.

CONTENTS OF INVENTION

The objective of the present invention is to provide a type of semiconductor light-emitting device. This type of device can prevent or reduce the loss caused by the light blockage of the electrode lead wire, thus having a higher light-emitting efficiency.

The objectives of the present invention are realized as follows:

One embodiment of the present invention provides a type of semiconductor light-emitting device that includes: a substrate; a semiconductor layer stack situated above the substrate, wherein the semiconductor layer stack includes at least one n-type layer and one p-type layer; an electrode situated above said semiconductor layer stack; and an electrode lead wire coupled to said electrode, wherein inside said semiconductor layer stack, at least the n-type layer or at least the p-type layer includes a void situated underneath said electrode lead wire.

One embodiment of the present invention provides a type of semiconductor light-emitting device that includes: a conductive substrate containing a main surface and a back surface; a metal bonding layer situated above the main surface of said conductive substrate; a reflective ohmic metal layer situated above said metal bonding layer; a semiconductor layer stack situated above said reflective ohmic metal layer, wherein the semiconductor layer stack includes at least one n-type layer and one p-type layer; an electrode situated above said semiconductor layer stack; an electrode lead wire coupled to said electrode, wherein said reflective ohmic metal layer includes a void situated underneath said electrode lead wire.

In one embodiment of the present invention, the void is formed inside the semiconductor epitaxial layer stack. After the removal of the semiconductor epitaxial layer stack situated underneath the electrode lead wire, little current will flow through the void; thus, no light will be generated. Therefore, if the same amount of current is injected into the device, the current density in other regions will increase, and the light generated at the void region will not be blocked by the electrode lead wire. Consequently, the light-emitting efficiency of the device will increase. The void can penetrate the whole layer stack, or it can be formed only inside the n-type layer or the p-type layer. The effect of the void is to prevent the formation of a p-n junction. In order to prevent short circuit or current leakage, the void formed after the removal of the semiconductor layer stack can be filled with insulating material, wherein said insulating material can be $SiO_2$, SiN, or $Al_2O_3$ with the preferred choice being SiN.

In a further embodiment of the present invention, the void can be formed inside the reflective ohmic metal layer. In this embodiment, a metal bonding layer and a reflective ohmic metal layer are located between the semiconductor layer stack and the substrate. Because the semiconductor layer stack is very thin, typically only several micron meters thick, it is difficult for the current to expand laterally in the semiconductor layer stack. In this embodiment, the reflective ohmic metal layer situated underneath the electrode lead wire is removed, thereby forming a void. Since no ohmic contact can be formed in this region, little current will be able to flow through, resulting in no light being generated. Almost all current flows through the region which is not blocked by the electrode lead wire; therefore, the current density in this region is increased, and as a result, the light-emitting efficiency is improved. The void inside the reflective ohmic metal layer can be filled with an insulating material or a conductive material which cannot form an ohmic-contact with the semiconductor layer stack, thus further blocking the current flow. The insulating material can be $SiO_2$, SiN, or $Al_2O_3$, with an preferred choice of SiN. The conductive material can be gold (Au), Chromium (Cr), etc.

The area of the void in the semiconductor layer stack or the reflective ohmic metal layer can be determined by the condition during device operation. The preferred area of the void is between half and twice the area of the projection of the electrode lead wire on the substrate.

The semiconductor layer stack can be formed using InGaAlN ($In_xGa_yAl_{1-x-y}N$, $0 \leq x \leq 1$, $0 \leq y \leq 1$) material, InGaAlP ($In_xGa_yAl_{1-x-y}P$, $0 \leq x \leq 1$, $0 \leq y \leq 1$), and InGaAlAs (($In_xGa_yAl_{1-x-y}As$, $0 \leq x \leq 1$, $0 \leq y \leq 1$) material. The preferred material is InGaAlN ($In_xGa_yAl_{1-x-y}N$, $0 \leq x \leq 1$, $0 \leq y \leq 1$).

The conductive substrate can be any commonly used semiconductor or metal materials, and the preferred choices include Si, GaAs, and sapphire.

The present invention has the advantage of being able to prevent or reduce the light loss caused by the light blockage of the electrode lead wire, thus improving light-emitting efficiency.

DETAILED DESCRIPTION OF EMBODIMENTS

Three embodiment examples further describe methods provided by the present invention.

Embodiment 1

Figure 1:
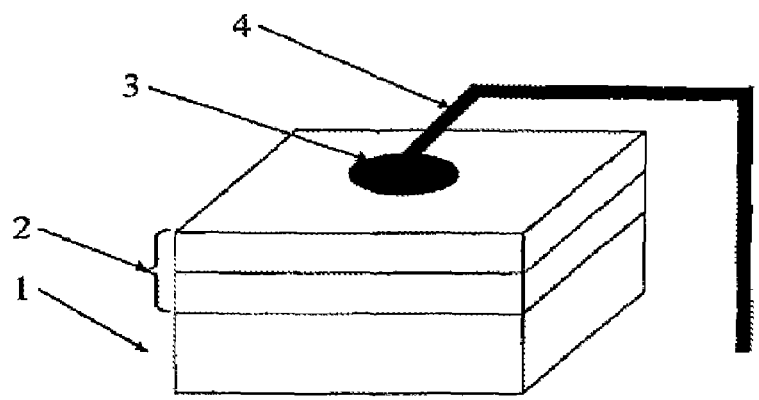
FIG. 1 illustrates the structure of a conventional LED. In the figure, label "1" refers to a substrate, label "2" refers to a semiconductor epitaxial layer stack, label "3" refers to a p-type electrode, and label "4" refers to a p-type electrode lead wire.
Figure 2:
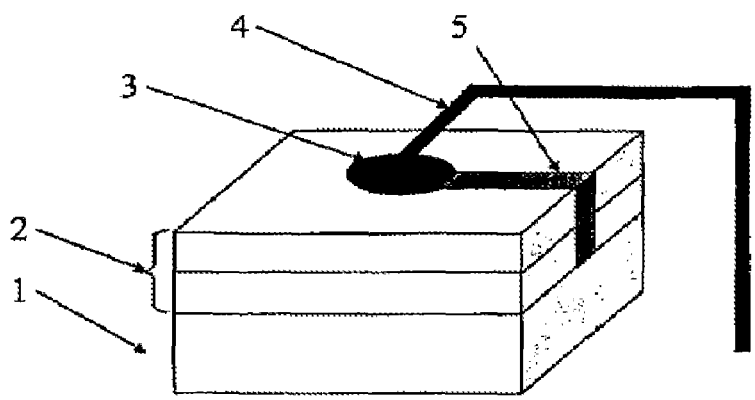
FIG. 2 illustrates the structure of an LED in accordance with embodiment 1 of the present invention. In the figure, label "1" refers to a substrate; label "2" refers to a semiconductor epitaxial layer stack; label "3" refers to a p-type electrode; label "4" refers to a p-type electrode lead wire; and label "5" refers to a void situated inside the semiconductor epitaxial layer stack. Void 5 is underneath p-type electrode lead wire 4, penetrating the entire epitaxial layer stack, and the void is filled with SiN.

Referring to FIG. 2, a GaAs substrate is cleaned and placed inside a chemical vapor deposition (CVD) chamber. An InGaAlP layer stack 2 is deposited according to a published method. The structure includes an n-type layer, a multi-quantum-well (MQW) light-emitting layer, and a p-type layer. After the deposition of the epitaxial layer stack, a region denoted by label "5" in FIG. 2 is etched away using inductively couple plasma (ICP) etching to form a void. This void penetrates the entire epitaxial layer stack. The void can be filled with $SiO_2$ using magnetron sputtering deposition and photolithographic techniques. Subsequently, a p-type ohmic electrode 3 is formed on the p-type layer, and an n-type ohmic electrode is formed on the backside of the substrate. The epitaxial wafer is then diced to form individual chips. Each individual chip is mounted on a packaging frame, and a gold wire, i.e., p-type electrode lead wire 4, is drawn right above void 5 reaching the p-type electrode. In the end, epoxy is used to seal the package.

Embodiment 2

Figure 3:
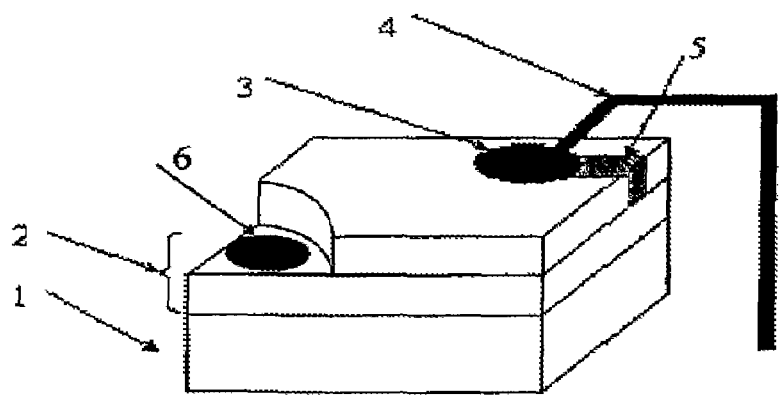
FIG. 3 illustrates the structure of an LED in accordance with embodiment 2 of the present invention. In the figure, label "1" refers to a substrate; label "2" refers to a semiconductor epitaxial layer stack; label "3" refers to a p-type electrode; label "4" refers to a p-type electrode lead wire; label "5" refers to a void situated inside the semiconductor epitaxial layer stack; and label "6" refers to an n-type electrode. Void 5 is underneath p-type electrode lead wire 4, penetrating only the p-type layer and the light-emitting layer, and the void is filled with SiN.

Referring to FIG. 3, a sapphire substrate 1 is cleaned and placed inside a chemical vapor deposition (CVD) chamber. An InGaAlN layer stack 2 is deposited according to a published method. The structure includes an n-type layer, an MQW light-emitting layer, and a p-type layer. After the deposition of the epitaxial layer stack, a region denoted as label "5" in FIG. 3 is etched away using ICP etching to form a void. This void penetrates the p-type layer. In the meantime, a sector-shaped region located at the corner of the square-shaped chip is etched off to expose the n-type layer. The void can be filled with SiN using magnetron sputtering deposition and photolithographic techniques. Subsequently, a p-type ohmic electrode 3 is formed on the p-type layer, and an n-type ohmic electrode is formed on the exposed n-type layer. The epitaxial wafer is then diced to form individual chips. A chip is mounted on a packaging frame, and a gold wire, i.e., p-type electrode lead wire 4, is drawn above void 5 reaching the p-type electrode 3. Another gold wire is drawn from the exposed n-type layer to the n-type electrode. In the end, epoxy is used to seal the package

Embodiment 3

Figure 4:
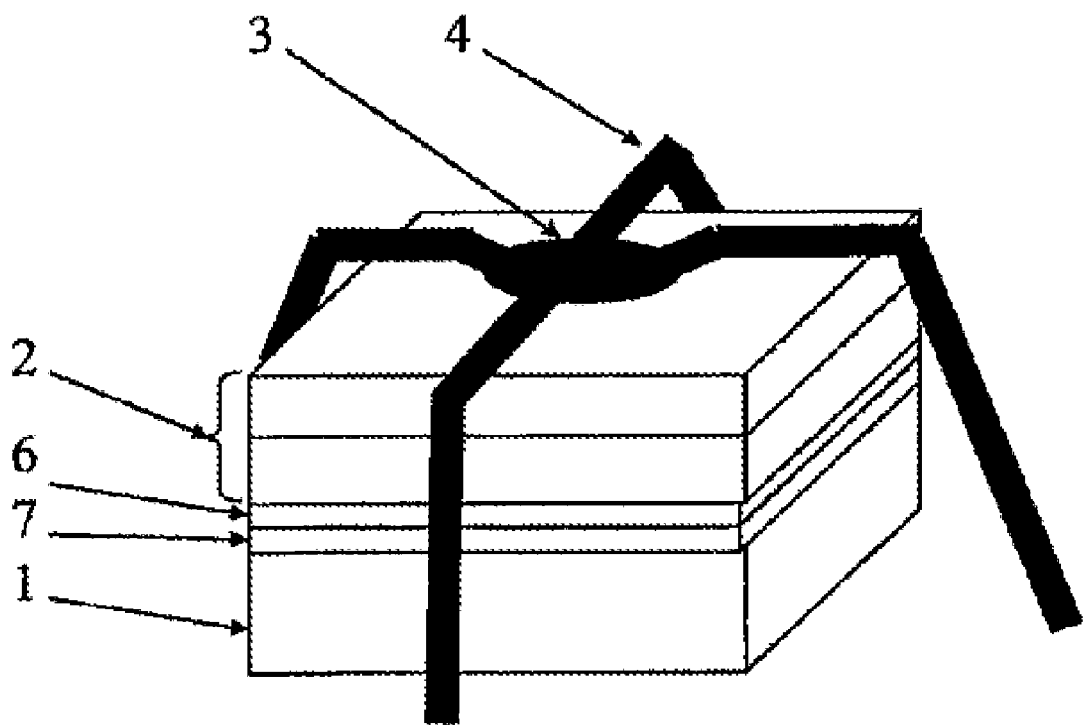
FIG. 4 illustrates the structure of an LED in accordance with embodiment 3 of the present invention. In the figure, label "1" refers to a substrate; label "2" refers to a semiconductor epitaxial layer stack; label "3" refers to an n-type electrode; label "4" refers to an n-type electrode lead wire; label "6" refers to a reflective ohmic metal layer; and label "7" refers to metal bonding layer.
Figure 5:
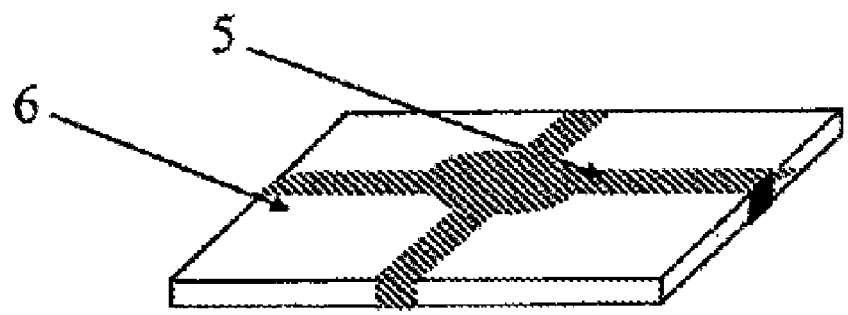
FIG. 5 is the plane view of the reflective ohmic metal layer 6 in FIG. 4. In the figure, label "5" refers to a void inside the reflective ohmic metal layer.

Referring to FIG. 4 and FIG. 5, sapphire substrate 1 is cleaned and placed inside a chemical vapor deposition (CVD) chamber. An InGaAlN layer stack 2 is deposited according to a published method. The structure includes an n-type layer, an MQW light-emitting layer, and a p-type layer. After the deposition of the epitaxial layer stack, a Pt reflective ohmic metal layer 6 is evaporated on the p-type layer. The Pt layer in the region denoted by label "5" in FIG. 5 is etched away using photolithographic and etching techniques to form a void. The void can be filled with either insulating materials (such as $SiO_2$, SiN, $Al_2O_3$, etc.) or conductive materials which do not form an ohmic-contact with the epitaxial layer stack (such as Au, Cr, etc.) using magnetron sputtering deposition and photolithographic techniques. Afterwards, metal bonding layer 7 is deposited on the Pt layer. The epitaxial wafer is bonded to another Si substrate, and the Si growth substrate is etched away. Subsequently, a p-type electrode is formed on the p-type layer, and an n-type electrode 3 is formed on the back of the Si substrate. The epitaxial wafer is then diced to form individual chips. A chip is mounted on a packaging frame, and a cross-shaped electrode lead wire as shown in FIG. 4, i.e., n-type electrode lead wire 4, is soldered right above void 5. In the end, epoxy is used to seal the package.

What is claimed is:

1. A semiconductor light-emitting device, the device comprising:
    a substrate;
    a semiconductor layer stack situated above the substrate, wherein the semiconductor layer stack comprises at least one n-type layer and one p-type layer;
    an electrode situated above said semiconductor layer stack;
    an electrode lead wire coupled to said electrode, wherein the electrode lead wire is situated at least partially parallel to the light-emitting surface of the light-emitting device;
    wherein at least the n-type layer or at least the p-type layer in said semiconductor layer stack comprises a void, wherein the void is situated in a region which the lead wire overhangs when viewed from a normal direction with respect to the light-emitting surface of the light-emitting device, and wherein the area of said void in the semiconductor layer stack is between half and twice the size of the area of the region that would otherwise be blocked by the electrode lead wire in the normal direction.

2. The semiconductor light-emitting device of claim 1, wherein said void is filled with an insulating material.

3. The semiconductor light-emitting device of claim 1, wherein said semiconductor layer stack is formed with InGaAlN material.

4. The semiconductor light-emitting device of claim 1, wherein said substrate is a sapphire substrate.

5. The semiconductor light-emitting device of claim 1, wherein said semiconductor layer stack is formed with InGaAlP material.

6. The semiconductor light-emitting device of claim 1, wherein said substrate is a GaAs substrate.

* * * * *